United States Patent [19]
Mukherjee

[11] 3,793,033
[45] Feb. 19, 1974

[54] DEVELOPMENT-FREE PRINTING PLATE

[75] Inventor: Joan M. W. Mukherjee, St. Paul, Minn.

[73] Assignee: Minnesota Mining and Manufacturing Company, St. Paul, Minn.

[22] Filed: Sept. 5, 1972

[21] Appl. No.: 286,111

[52] U.S. Cl. ..................... 96/115 R, 96/33, 101/456
[51] Int. Cl. ................................................ G03c 1/68
[58] Field of Search..... 96/33, 115 R, 90 R; 156/13; 204/159.11; 101/456

[56] References Cited

UNITED STATES PATENTS

| | | | |
|---|---|---|---|
| 3,231,378 | 1/1966 | Silver | 96/33 |
| 3,615,532 | 10/1971 | Silver | 96/33 |
| 3,651,170 | 3/1972 | Silver | 96/33 |
| 3,409,487 | 11/1968 | Fry | 156/13 |
| 3,285,745 | 11/1966 | Silver et al. | 96/90 R |
| 3,287,128 | 11/1966 | Lugasch | 96/33 |
| 3,715,210 | 2/1973 | Watkinson et al. | 96/33 |
| 3,549,373 | 12/1970 | Hamada et al. | 96/33 |
| 3,388,995 | 6/1968 | Schwerin | 96/33 |
| 3,459,128 | 8/1969 | Erdmann et al. | 96/33 |
| 3,615,452 | 10/1971 | Cerwonka | 96/115 P |

*Primary Examiner*—Norman G. Torchin
*Assistant Examiner*—Edward C. Kimlin
*Attorney, Agent, or Firm*—Alexander, Sell, Steldt, & Delahunt

[57] ABSTRACT

A presensitized, light-sensitive article capable of providing a lithographic printing plate requiring only image-wise exposure to actinic light and no subsequent image development is provided. The article is comprised of a support coated with a hydrophilic composition comprised of: 1) an organic solvent-soluble phenolic resin, and 2) a hydroxyethylcellulose ether, and in reactive association therewith a photoinitiator capable of generating free radicals on exposure to actinic light. Upon imagewise exposure the coated composition becomes more oleophilic in exposed image areas, while remaining hydrophilic and water-receptive in unexposed background areas.

11 Claims, No Drawings

DEVELOPMENT-FREE PRINTING PLATE

FIELD OF THE INVENTION

This invention relates to lithographic printing plates, and more particularly to lithographic printing plates having a photosensitive printing surface requiring only image exposure prior to use of the plate on a printing press, no additional processing or special equipment being required.

BACKGROUND OF THE INVENTION

Planographic printing plates, commonly utilized in offset lithography, have oleophilic (ink receptive) image areas and hydrophilic (water receptive) non-image areas. A typical example of a photosensitive planographic plate utilizes a light-sensitive diazo resin layer on a suitable water-wettable support material. Upon exposure to actinic radiation, the diazo resin layer insolublizes relative to its initial state such that exposed areas can be selectively removed by developing solutions, thereby exposing the underlying water-receptive plate support material. The insoluble image-exposed area of the diazo layer remaining after development is oleophilic. With this conventional plate, choice and treatment of the plate support material becomes critical, since the support must provide the water-receptive non-image areas upon image development.

Photosensitive plates requiring only image exposure to actinic radiation without an additional image development step are generally known in the art. One such plate is known as the Collotype plate, in which a support material is overcoated with a photosensitive dichromated gelatin. Initially the overcoating is soft and hydrophilic, but it becomes harder and less hydrophilic in proportion to the amount of actinic light exposure received during imaging. Therefore, the imaged overcoating remains water-receptive in unexposed areas, and is oleophilic in exposed areas in proportion to the amount of actinic light received during exposure. Although high quality prints can be obtained utilizing a Collotype plate, a high quantity of reproductions can not be produced due to the poor abrasion resistance of the gelatin overcoating. Additionally, the plates cannot be presensitized and stored for periods of time because of instability of the photosensitive overcoating.

More recently, development-free printing plates having improved abrasion resistance have been disclosed. These plates generally contain a printing surface of a photosensitive composition comprised of an association product of a phenolic resin and an ethylene oxide polymer, and a photosensitizer, as described in U. S. Pat. Nos. 3,231,378; 3,285,745; and 3,409,487. In light-exposed areas of the plate, oxidation of the phenolic resin occurs, thereby increasing the hardness and oleophilicity of the exposed areas in comparison with the unexposed areas. Although superior to Collotype plates, the foregoing plates have a tendency to blind, i.e., lose oleophilicity in exposed image areas. Additionally, the plates are generally excessively hydrophilic and therefore difficult to ink properly without critical control of a satisfactory ink/water balance.

This invention provides a presensitized light-sensitive printing plate requiring only imagewise exposure prior to utilization on a printing press which can provide numerous high quality prints without blinding, and which is effective over wide variations of ink/water press settings in conventional printing presses. The unexposed areas of the photosensitive composition are hydrophilic and therefore water receptive, exposed areas becoming increasingly oleophilic in proportion to the amount or quantity of the actinic radiation received.

SUMMARY OF THE INVENTION

In accordance with the invention there is provided a presensitized, light-sensitive sheet construction capable of providing a lithographic printing plate upon imagewise exposure to actinic radiation. The article comprises:

a. a support, and b. overlying the support, a thin, continuous layer of hydrophilic composition comprising:

1. from about 0.5 to about 3.0 parts by weight of an organic solvent-soluble phenolic resin which contains at least three hydroxy-substituted benzene rings per 1000 molecular weight, per part of 2. a hydroxyethyl cellulose ether having about 1 to about 5 oxyethyl groups per anhydroglucose unit of cellulose, and c. a photoinitiator which is reactively associated with the hydrophilic composition and is capable of generating free radicals upon exposure to actinic radiation.

The hydrophilic composition is rendered more oleophilic and oleo-ink receptive in areas exposed to actinic radiation, whereas unexposed areas remain hydrophilic and water-receptive. Therefore imagewise exposure through a negative or transparency is the only step required to form a planographic printing plate.

The degree of oleophilicity in the composition occurring as a result of irradiation is proportionate to the intensity of the radiation transmitted. Therefore, the printing plate is capable of printing in continuous tone, or, by exposure through conventional half-tone screens, in half tone.

Besides not requiring wet development processing, the printing plate is non-blinding, and does not require criticality of printing press settings to maintain optimum ink/water ratios for proper inking and reproductive quality.

DETAILED DESCRIPTION OF THE INVENTION

The basic overlayer composition is comprised of a phenolic resin and a hydroxyethylcellulose ether, with photosensitivity arising as a result of a photoinitiator compound reactively associated with the hydrophilic composition which is capable of generating free radicals upon exposure to actinic radiation.

By the term phenolic resin is meant an organic solvent-soluble polymeric resin containing at least three hydroxy substituted benzene rings in the polymer chain or pendant to the polymer backbone per 1000 molecular weight. Examples of suitable phenolic resins include 1) the novolak phenol-aldehyde condensation resins, 2) the resole phenol-aldehyde condensation resins, and 3) resins containing hydroxybenzene moieties. The resins are substantially insoluble in water and lower alcohols but are soluble in organic solvents such as acetone, dioxane, dimethylformamide and tetrahydrofuran.

Novolak resins are generally prepared by the condensation of formaldehyde with phenols or phenolic compounds, for example, cresol, xylenol, butylphenol, chlorophenol, resorcinol and bis(hydroxyphenol) methane under acidic conditions. Their preparation is well known in the art, illustrated for example by The Chemistry of Phenolic Resins, John Wiley & Sons, Inc., New York, New York (1956) at pages 87–116, and also by U. S. Pat. No. 2,475,587.

Commercially available novolak resins such as that with the tradename "Alnoval 429K", a cresol-formaldehyde condensation product available from the American Hoechst Co., are also useful.

Resole resins are generally prepared utilizing the same precursors as those illustrated for novolak resins, the difference being that the condensation reaction occurs in an alkaline environment. Their preparation is well illustrated in The Chemistry of Phenolic Resins cited above.

Resins containing hydroxybenzene moieties include for example hydroxybenzaldehyde derivatives of polyvinyl alcohol having the structural formula

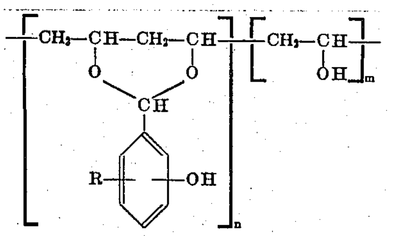

where R is hydrogen, a lower alkyl, or alkoxy group having from 1 to 4 carbon atoms, n has a value from about 100 to about 5,000 ore more, and m has a value from about 5 to about 2,000 or more. Examples include the polyvinyl acetals of hydroxy alkyl benzaldehydes such as 2-hydroxy-3-methylbenzaldehyde. These compounds are generally prepared by the acid catalyzed reaction of hydroxybenzaldehydes with polyvinyl alcohol as taught in Preparative Methods of Polymer Chemistry, 2nd Ed., Interscience Pub., New York, New York (1968) at page 242.

The hydroxyethylcellulose ethers useful in the hydrophilic composition of the invention are generally known in the art and have been employed in printing plates requiring solvent development as taught, for example, in U. S. Pat. No. 3,287,128. They are generally water-soluble and can be prepared by the reaction of cellulose with ethylene oxide or by the reaction of alkali cellulose with ethylene chlorohydrin.

Although hydroxyethylcellulose ethers having molecular weights as low as 50,000 are suitable for use in the invention, the preferred hydroxyethylcellulose ethers are those having a high molecular weight, i.e., from 250,000 to 500,000 and having about 1 to about 5 oxyethyl groups per anhydroglucose unit of cellulose. Use of low molecular weight ethers, i.e., about 50,000 molecular weight, may provide a hydrophilic composition which is soluble in conventional fountain solutions, thereby reducing the life of a printing plate utilizing the composition. Examples of suitable hydroxyethylcellulose ethers are those commercially available from the Hercules Powder Company, including those with the tradenames "Natrosol 300HH," "Natrosol 180HH," and "Natrosol 300H4R," having 3, 1.8, and 3 oxyethyl groups per anhydroglucose unit of cellulose, respectively.

In order to obtain a proper oleophilic/hydrophilic balance in the exposed versus unexposed areas of a printing plate, it is necessary that the weight ratio of phenolic resin to hydroxyethylcellulose ether generally be between about 0.50/1 to 3.0/1, and preferably between about 0.5/1 to 1.5/1. Quantities of phenolic resin above these limits may yield printing plates that are too oleophilic and consequently excessively ink receptive in the unexposed background area. Conversely, quantities of phenolic resin in amounts below these limits may yield printing plates that are too hydrophilic and therefore not sufficiently oleophilic to hold ink in the exposed areas.

The photoinitiators employed in the practice of this invention are those which are capable of producing free radicals having an unpaired electron on exposure to actinic radiation. It is postulated, although this theory should not be considered limiting, that the free radicals formed upon exposure to actinic radiation react to bring about oxidation of the phenolic resin and tanning of the hydroxyethylcellulose ether, thereby rendering the exposed portion of the composition more hydrophobic and oleophilic. In addition, the degree of oleophilicity is proportionate to the degree of radiation intensity received by the composition. Since this is true, continuous tone exposure can be obtained. Alternatively, half-tone images can be prepared by exposure through conventional half-tone screens.

Examples of suitable photosensitive initiators include dichromates, such as sodium or potassium dichromate; diazonium salts such as 4-(N-phenylamino) benzene diazonium hexafluorophosphate and 2-methylbenzenediazoniumfluoroborate; azido compounds such as the sodium salt of 4,4'-diazidodiphenyl-2,2'-di-sulfonic acid, and 4,4'-diazidostilbene; nitrophenols such as 2,6-dichloro-4-nitrophenol and 2-methoxy-4-nitrophenol; iodonium salts, such as those disclosed in assignee's co-pending application Ser. No. 205,392; and organic halogen-containing compounds. Organic halogen-containing compounds useful as photoinitiators, disclosed in U. S. Pat. Nos. 1,587,270 through 1,587,274 and assignee's co-pending patent application Ser. No. 177,851, have the general formula:

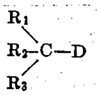

wherein D may be chlorine, bromine, or iodine, and $R_1$, $R_2$, and $R_3$ may be chlorine, bromine, iodine, hydrogen, or alkyl (which may or may not be substituted by halogen) or aryl, aralkyl, alkenyl, or a heterocyclic group. These latter four groups may also be substituted by alkyl or halogen or preferably by a chromophoric group. $R_1$, $R_2$, and $R_3$ may be the same or different or taken together may form part of a heterocyclic ring. Examples of compounds falling under this general definition include iodoform, tetrabromoethane, hexachlorobenzene, the preferred halomethyl-s-triazines, e.g., trichloromethyl-s-triazine, and the more preferred chromophore substituted vinyl-halomethyl-s-triazines disclosed in assignee's co-pending U. S. application Ser. No. 177,851. These photolyzable s-triazines having at least one trihalomethyl group and at least one chromophoric moiety conjugated with the triazine ring by ethylenic unsaturation. An example is 2,4-bis(trichloromethyl)-6-p-methoxystryryl-s-triazine.

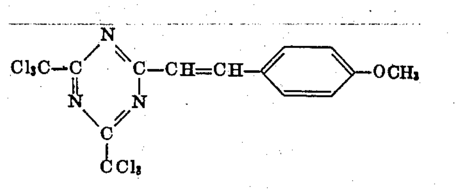

An effective amount of photoinitiator may be present to promote crosslinking as can be ascertained by those skilled in the art. A suitable concentration range is from about 1:100 to about 1:3 parts by weight of photoinitiator to parts by weight of combined phenolic resin and hydroxyethylcellulose ether.

Although some of the photoinitiators described above may undergo color change on exposure to actinic radiation, it may be advantageous to add indicator dyes to enhance a color change. Color change, for example, may be a test utilized to visually determine optimum exposure times. Suitable indicator dyes include photochromic dyes, e.g., 1′, 3′, 3′-trimethyl-6-nitrospiro (2H)-1-benzopyran-2,2′-indoline which changes from colorless to blue on exposure to actinic radiation; pH indicator dyes, e.g., Bromcresol green; and leuco dyes, e.g., leucotriphenylmethane. The pH indicator and leuco dyes change color upon generation of an acidic environment, and therefore should be used only with photoinitiators such as the halogen-containing organic initiators which by their nature generate an acidic condition upon exposure.

It may also be advantageous to include in the hydrophilic composition curing agents for hydroxyethylcellulose ethers and/or phenolic resins to improve the toughness and abrasion resistance of the coated printing plate. Suitable curing agents for the hydroxyethylcellulose ethers include methylol urea, dimethyl methylol urea, hexamethoxymethyl melamine, and polyisocyanates, e.g., toluene-2,4-diisocyanate. Hexamethylenetetramine is an example of a suitable curing agent for phenolic resins.

An effective amount of curing agent is readily ascertained, generally from about 2 to about 15 percent or more by weight based on the total weight of the hydroxyethylcellulose ether and phenolic resin components of the hydrophilic composition being satisfactory. Curing of the hydroxyethylcellulose ethers can generally be effected at temperatures up to about 70° C. for a few minutes up to several hours depending upon the choice of curing agent and its concentration, higher concentrations generally requiring less cure time. For curing phenolic resins, temperatures of about 130° C. are satisfactory. For example, with the hexamethylene tetramine curative, about 30 minutes to 1 hour at 130° C. is satisfactory to cure the phenolic resin of the hydrophilic composition.

In addition, other additives can be utilized to impart desirable characteristics, such as improvement of adhesion of the composition to the support, increase of hydrophilicity, increase of film toughness, or increase in the stability of photoinitiators. Polymers containing sulfonic acid groups may be incorporated to improve the adhesion of the composition to the support and to increase the stability of diazonium salt photoinitiators. Alternatively, polymer containing sulfonic acid groups can be applied to the support as a primer or subbing coat prior to the application of the hydrophilic composition. Examples of suitable polymers include novolak resins prepared by the condensation of p-hydroxybenzenesulfonic acid and formaldehyde, and the polymeric product obtained by the sulfonation of polystyrene. Epoxy resins and sodium sulfonated cellulose are examples of film tougheners.

Surfactants may be added to the hydrophilic composition to increase its hydrophilicity. The use of surfactants can be especially beneficial when the composition contains greater than about 1 part by weight of phenolic resin per part by weight of hydroxyethylcellulose ether. Especially suitable surfactants are the ionic surfactants such as those having sulfate and phosphate groups, an example of which is that sold under the tradename "Triton GR-5," commercially available from the Rohm and Haas Company. Surfactant concentrations of from about 0.05 to about 5.0 percent by weight based on the total weight of the hydroxyethylcellulose ether and phenolic resin in the composition are generally acceptable.

Since the support does not have to provide one of the printing surfaces, a wide variety of substrates are available for use. These include sheets or plates of metals, especially aluminum and stainless steel, paper, polymeric materials such as polyesters, polystyrene, and polyvinylchloride, chrome plated steel, and plastic-aluminum laminates. Preferred supports are polyesters and paper. If desired, the support may be treated to improve the adhesion of the hydrophilic composition. Application of a thin coating of a polymer containing sulphonic acid groups as previously discussed, or an organic film-forming polyacid as taught by U. S. Pat. No. 3,136,636 is suitable to improve adhesion.

The sheet construction of the invention can generally be prepared by coating an emulsion of the hydrophilic composition on a support, which preferably has been cleaned of surface impurities and optionally treated with adhesion-improving agents and antihalation agents. The composition emulsion can be conveniently prepared by adding about 0.5 to about 5.0 percent by weight of an aqueous solution of hydroxyethylcellulose ether to a 1 to about 10 percent by weight solution, for example a dimethylformamide solution, of a phenolic resin. The phenolic resin solution can also generally contain curing agents, surfactants, indicator dyes, and other additives. The aqueous hydroxyethylcellulose ether solution can conveniently contain up to about 30 weight percent or higher of an alcohol, such as methyl or ethyl alcohol, to accelerate drying of the coating and to prevent fungal growth on the hydroxyethylcellulose ether. The mixture is then conventionally agitated to obtain complete mixing and homogeneity.

The emulsion can be conveniently knife coated at a wet thickness of about 3 to about 15 mils, followed by drying. Corresponding dry coating weights of about 0.06 to about 0.30 gram/square foot dry film and thicknesses of about 0.5 to about 2.5 microns result. Higher coating weights, while not detrimental, provide no additional benefits in the operation of the invention. The film can then be cured if optional curatives are present.

The plate can then be photosensitized by applying, under subdued light conditions, a photoinitiator solution over the hydrophilic layer. A convenient coating means, such as knife coating, can be utilized. Solution concentrations of photoinitiator from about 0.10 percent to about 5 percent by weight are generally acceptable for the coating application. Solvents available are those which readily dissolve the particular initiator, and include water, acetone, methanol, dioxane, dimethylformamide. The sensitizer overcoating is dried to remove solvent leaving a residue of approximately 0.003 to 0.030 grams of photoinitiator per square foot.

Alternatively, the printing plates can be photosensitized by direct incorporation of one or more photoinitiators into the hydrophilic emulsion composition prior to intial coating onto the support. Generally, the thermal stability of the photoinitiator is the determining factor as to whether direct incorporation into the hydrophilic composition is feasible, especially where it is desirable to cure the phenolic resin. As a general rule, if curing of the phenolic resin is to be undertaken, the photoinitiator should be applied as a separate coating after such curing is completed.

The presensitized, light-sensitive printing plate can then be cut to standard plate sizes and packaged in light-proof packages. In this manner, the plates are stable, and may be stored for several weeks or months without appreciable degradation.

In use, the printing plates are removed from their light-proof package under subdued light, placed under a negative transparency of the image desired to be printed, and exposed through the transparency to actinic radiation. Required exposure times vary, depending on the choice of photoinitiator employed in the plate and the exposure source available. Any conventional light sources can be effectively used for exposure, the choice dependent on the optimum workable photoinitiator absorption range. In a printing frame under a carbon arc, for example, adequate exposure is from about 1 to about 5 minutes when the photoinitiator is a dichromate salt. When a diazonium salt is utilized as the photoinitiator, exposure times generally are somewhat shorter under a carbon arc.

Upon exposure, the plate may be mounted on a lithographic press utilizing conventional oleo-inks and fountain solutions. The oleophilic exposed areas ink rapidly, and satisfactory prints are obtained without requiring critical adjustment of fountain solution/ink ratios. The conventional aqueous fountain solutions effectively desensitize the unexposed areas of the plate but do not remove the polymeric hydrophilic composition. Should it be desirable to store the exposed plate in the light prior to use in a printing press, the unexposed portions of the plate may be effectively desensitized by washing or rinsing the plate with water or other solvent used for the photosensitizer application.

The following examples will serve to illustrate specific embodiments of the invention, but should not be construed as limiting. Unless otherwise specified, parts by weight are utilized.

EXAMPLE 1

This example illustrates the preparation of the hydrophilic composition and the preparation therefrom of a printing plate of this invention.

Solutions are prepared as follows:

A. A phenolic resin solution is prepared by dissolving 5 parts p-cresol formaldehyde novolak resin in 95 parts dimethylformamide.

B. A hydroxyethylcellulose ether solution is prepared by dissolving 1 part "Natrosol 300HH" (tradename for a hydroxyethylcellulose ether having 3 oxyethyl groups per anhydroglucose residue, available from the Hercules Chemical Company) in 99 parts of aqueous methanol (7 parts water to 3 parts methanol by volume).

One hundred parts of Solution B is then added to 20 parts of Solution A while stirring vigorously. There is obtained a stable white emulsion which is knife coated at a wet coating thickness of 3 mils onto 5 mil polyester film. The coated film is heated at 50° C. whereupon the coating dries clear, tough, and nontacky.

The hydrophilic composition-coated film is photosensitized by dip coating under subdued light into a 1 percent by weight methanol solution of 4-(N-phenylamino) benzene diazonium hexafluorophosphate followed by drying at room temperature.

The dried coated film is then cut into standard plate sizes and packaged in light proof packages.

The photosensitive film is exposed under a negative transparency to form pale blue images on a yellow unexposed background. In a standard printing frame using a 15 ampere carbon arc light at a distance of about 2 feet, an exposure of about 1 minute is required. With an ultraviolet light source in a Colitho printmaker, the exposure time is about 1½ minutes.

The exposed plate is then placed on a lithographic printing press provided with standard fountain solution and oleo-ink, whereupon sharp prints having clean backgrounds are obtained after only a few imprints.

Similar results are obtained where Experiment 1 is repeated using "Natrosol 250HH", a tradename for a hydroxyethylcellulose ether having 2.5 oxyethyl groups per anhydroglucose residue, or "Natrosol 180HH," tradename for a hydroxyethylcellulose ether having a 1.8 oxyethyl groups per anhydroglucose residue.

When Experiment 1 is repeated using a 1 percent solution of ammonium dichromate in a 1:1 by volume mixture of dimethylformamide-water to photosensitize the hydrophilic coating, the plate obtained requires about 3 minutes exposure using a 15 ampere carbon arc light at a distance of about 2 feet. Sharp prints having clean backgrounds are obtained.

EXAMPLE 2

This example illustrates the use of a hydroxybenzaldehyde derivative of polyvinyl alcohol as the phenolic resin.

A solution of 25 g. of polyvinylalcohol (available from the DuPont Company under the tradename "Elvanol 70-05"), 20 ml. of methyl alcohol, and 0.075 g. of sulfuric acid in 210 ml. of water is prepared by mixing and heating the ingredients in a vessel equipped with a mechanical stirrer. One fourth of the syrupy solution is placed in a 3-necked flask equipped with stirrer, reflux condenser, adding funnel and thermometer. While stirring vigorously, 42.5 g. of o-vanillin (2-hydroxy-3-methoxybenzaldehyde) in 50 ml. methanol is added. Over a period of 30 minutes, the remainder of the polyvinyl alcohol solution is added while warming the contents of the flask to 70° C. Then, 150 ml. of water at 70° C. and 0.75 g. sulfuric acid is added and the contents of the flask are heated for 1 hour at 60° to 70° C. The phenolic resin which separates from solution is filtered, washed with 5 percent aqueous sodium carbonate, with water, with methanol, and finally dried.

The procedure for the preparation of the printing plate used in Example 1 is repeated with the exception that the polyvinyl 2-hydroxy-3-methoxybenzaldehyde is used in place of the p-cresol formaldehyde novolak. Sharp prints having a clean background are obtained and the plate operates for a minimum of 300 copies without observable degradation.

EXAMPLE 3

This example illustrates the preparation of a printing plate of the invention wherein the hydrophilic composition is cured.

Into a reaction vessel is placed 268 parts of 65 percent p-phenolsulfonic acid in water and 96 parts of 36 to 38 percent formaldehyde in water. The mixture is stirred vigorously and gently heated to 80° C. and then cooled rapidly. A gel results which is a novolak resin (4-hydroxybenzene sulfonic acid formaldehyde novolak). The gel can be utilized directly without further processing.

To solution A of Example 1 is added:

0.2 parts Triton GR-5 (tradename for dioctyl sodium sulfasuccinate, a surfactant to improve water wetability, available from the Rohm and Haas Company)

0.5 parts 4-hydroxybenzene sulfonic acid formaldehyde novolak 0.5 parts Cymel 300 (tradename for hexamethyoxymethyl melamine, a curing agent for hydroxyethylcellulose ethers, available from the American Cyanimide Company)

To solution B of Example 1 is added:

0.5 parts Kelco SCS XL (a tradename for sodium sulfonated cellulose, a film toughener, available from Kelco Corporation)

Example 1 is then repeated to obtain a sensitized film. The film is cured by heating for 10 minutes at 80° C. and cut into standard printing plate sizes. When exposed to actinic radiation under a negative transparency, pale blue images on a yellow unexposed background are obtained. The exposed plate is utilized on a lithographic printing press provided with standard fountain solution and ink. As many as 5,000 sharp prints having clean backgrounds are obtained.

EXAMPLE 4

This example illustrates the preparation of the hydrophilic composition with the sensitizer included therein.

Solutions are prepared as follows:

A. 7.1 parts p-cresol formaldehyde novolak resin 1.4 parts Epon 1004 (tradename for an epoxy resin, useful as a film toughener, available from the Shell Chemical Company)

1.0 parts Triton GR-5 (tradename for dioctyl sodium sulfosuccinate, a surfactant to improve water wetability, available from the Rohm and Haas Company.)

3.5 parts 2,4-bis(trichloromethyl)-6-p-methoxystyryl-s-triazine 273.8 parts dimethylformamide B. 7.1 parts Natrosol 300HH (tradename for a hydroxyethylcellulose ether having 3 oxyethyl groups per anhydroglucose residue, available from the Hercules Chemical Company)

206.1 parts methanol 500.0 parts water

The two solutions are mixed and thoroughly agitated to provide a homogeneous emulsion which is knife coated at a wet coating thickness of 3 mils onto 5 mil polyester film. The coated film is heated at 50° C. whereupon the coating dries tough and nontacky.

Exposure of the light-sensitive sheet is carried out as per Example 1, whereupon similar results are obtained.

What is claimed is:

1. A presensitized photosensitive sheet construction capable of providing a lithographic printing plate upon image-wise exposure to actinic radiation comprising:

1. a support,
2. overlying said support a layer of hydrophilic composition capable of being rendered more oleophilic in areas exposed to actinic radiation comprising:
   a. from about 0.5 to about 3.0 parts by weight of an organic solvent-soluble phenolic resin containing at least 3 hydroxy-substituted benzene rings per 1,000 molecular weight of said resin, per part of
   b. a hydroxyethylcellulose ether having about 1 to about 5 oxyethyl groups per anhydroglucose unit of cellulose, and
3. a photoinitiator reactively associated with said hydrophilic composition and capable of generating free radicals upon exposure to actinic radiation.

2. The article of claim 1 wherein said photoinitiator is situated in a separate adjacent layer from said layer of hydrophilic composition.

3. The article of claim 1 wherein said hydrophilic composition contains a curing agent for said phenolic resin.

4. The article of claim 3 wherein said phenolic resin is cured.

5. The article of claim 1 wherein said hydrophilic composition contains a curing agent for said hydroxyethylcellulose ether.

6. The article of claim 5 wherein said hydroxyethylcellulose ether is cured.

7. The article of claim 1 wherein said photoinitiator is incorporated into said layer of said hydrophilic composition.

8. The article of claim 1 wherein said phenolic resin is a novolak phenolic resin.

9. The article of claim 1 wherein said phenolic resin is a resole phenolic resin.

10. The article of claim 1 wherein said phenolic resin is a hydroxybenzaldehyde derivative of polyvinyl alcohol.

11. The article of claim 1 wherein said hydroxyethylcellulose ether has a molecular weight between about 250,000 and 500,000.

* * * * *